(12) United States Patent
Hensley et al.

(10) Patent No.: US 7,215,536 B2
(45) Date of Patent: May 8, 2007

(54) ELECTROMAGNETIC SHIELD ASSEMBLY

(75) Inventors: James D. Hensley, Rocklin, CA (US); Andrew H. Dickson, Fair Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 485 days.

(21) Appl. No.: 10/328,765

(22) Filed: Dec. 23, 2002

(65) Prior Publication Data
US 2004/0120130 A1 Jun. 24, 2004

(51) Int. Cl.
*H05K 9/00* (2006.01)

(52) U.S. Cl. ................. 361/679; 174/35 R; 361/816

(58) Field of Classification Search ........ 361/679–687, 361/724–727, 801–816; 174/35 R; 439/638, 439/95, 552; 29/747, 831; 267/158, 160; 385/92
See application file for complete search history.

(56) References Cited

U.S. PATENT DOCUMENTS

| | | | |
|---|---|---|---|
| 6,172,880 B1 | 1/2001 | Petitpierre et al. | 361/801 |
| 6,652,159 B2 * | 11/2003 | Chan et al. | 385/92 |
| 6,683,792 B2 * | 1/2004 | Shirakami et al. | 361/796 |
| 6,697,258 B1 * | 2/2004 | Muhlfeld et al. | 361/729 |
| 6,826,057 B1 * | 11/2004 | Gundogan et al. | 361/726 |
| 2003/0070826 A1 * | 4/2003 | Cerniglia et al. | 174/35 R |
| 2004/0029447 A1 * | 2/2004 | Neer et al. | 439/638 |
| 2004/0069515 A1 * | 4/2004 | Norte et al. | 174/35 GC |

FOREIGN PATENT DOCUMENTS

| | | |
|---|---|---|
| DE | 19544835 C1 | 10/1996 |
| GB | 2303254 A | 2/1997 |

\* cited by examiner

*Primary Examiner*—Hung Van Duong

(57) ABSTRACT

An electromagnetic shield assembly is disclosed. In one embodiment, the present invention is comprised of a frame. The present embodiment is further comprised of an electromagnetic gasket surrounding the frame. The present embodiment is also comprised of an actuating element coupled with the electromagnetic gasket. The actuating element is adapted to retract and deploy a portion of the electromagnetic gasket with respect to the frame to provide an adjustable electromagnetic interference (EMI) shield.

21 Claims, 6 Drawing Sheets

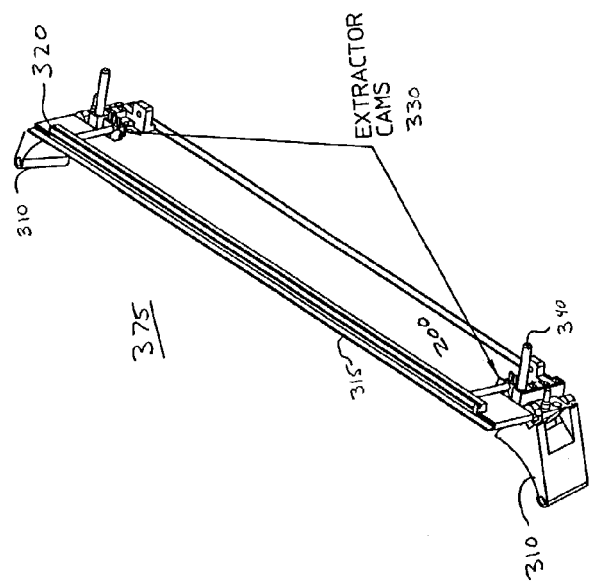
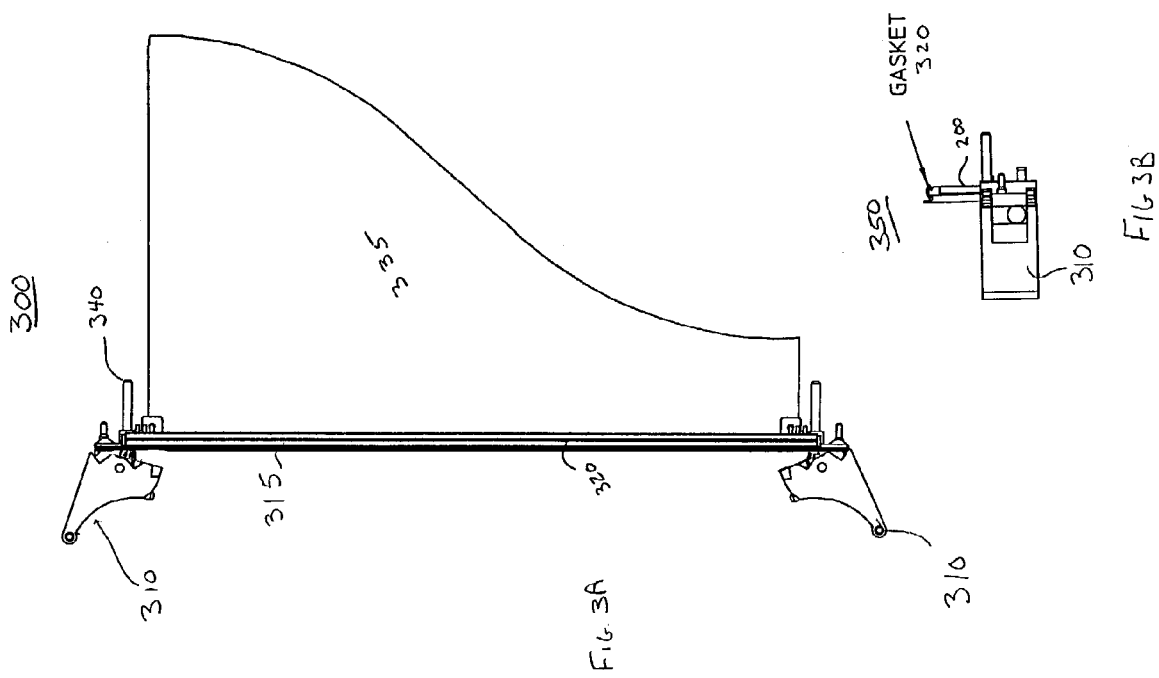
FIG 3C
FIG 3B
FIG 3A

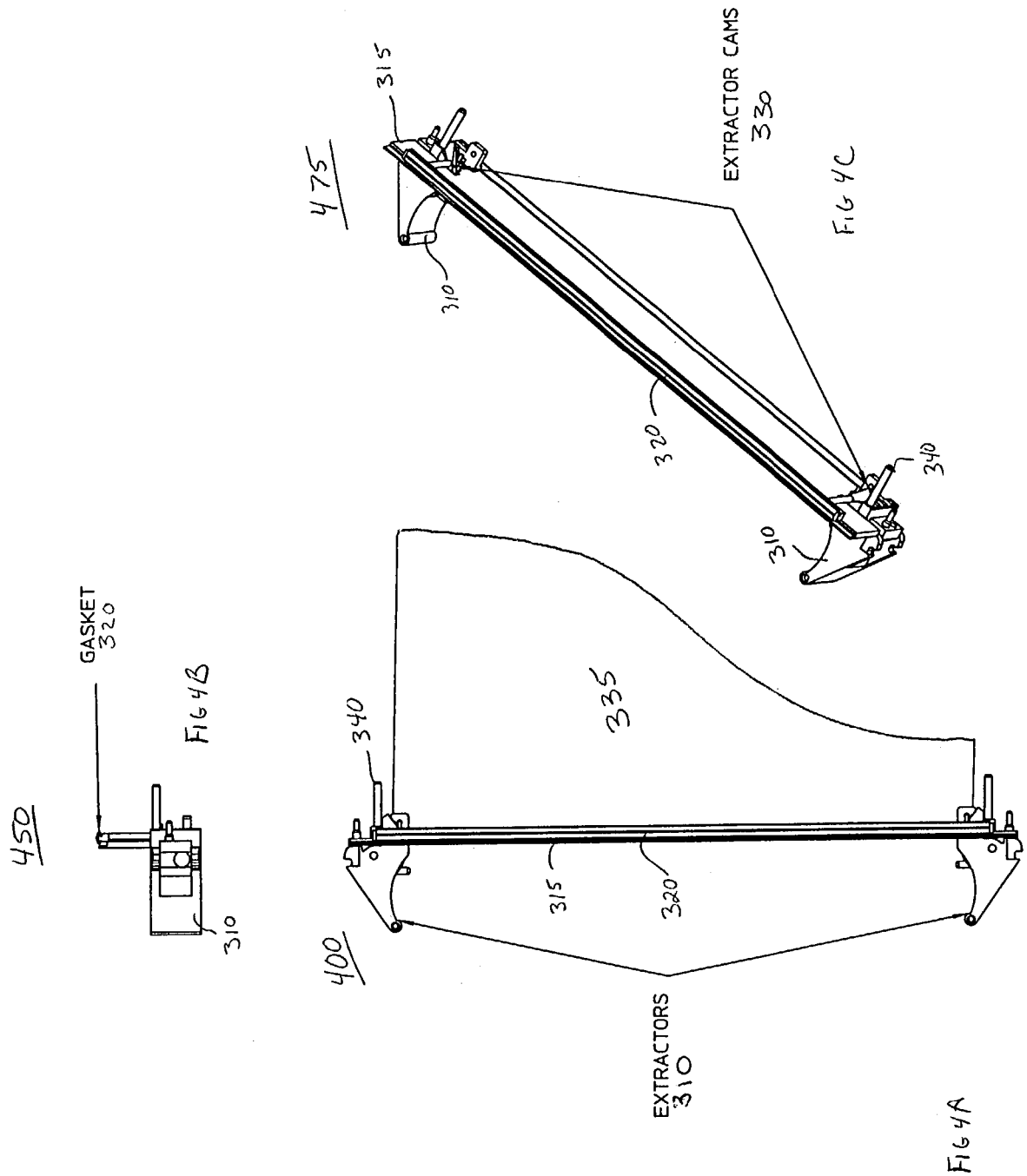

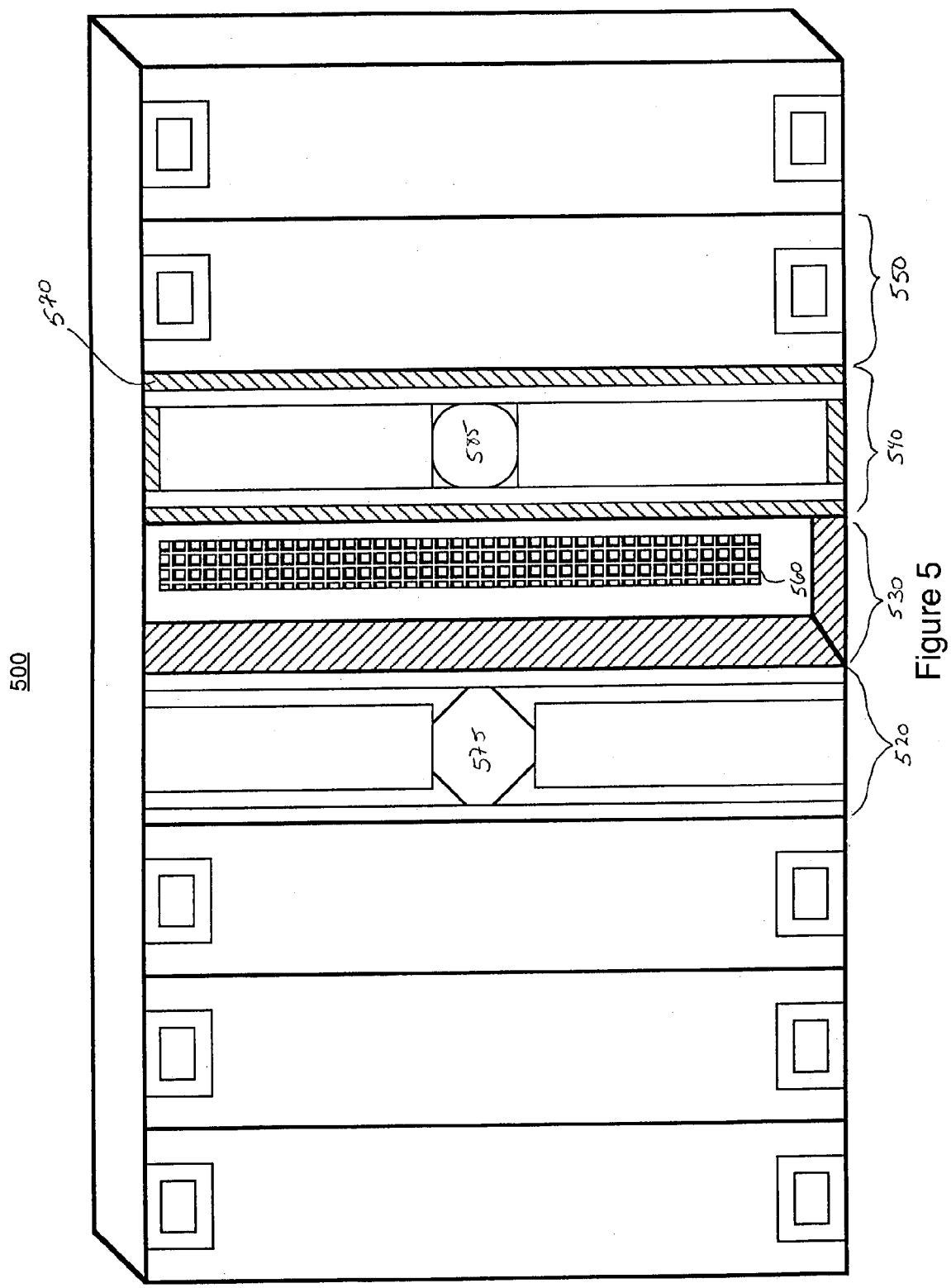

ELECTROMAGNETIC SHIELD ASSEMBLY

TECHNICAL FIELD

The present claimed invention relates to the field of electromagnetic interference. More specifically, the present claimed invention relates to an electromagnetic shield assembly for reducing electromagnetic interference.

BACKGROUND ART

In most electronic systems, the desire for smaller devices and the reduced space requirements for installing the smaller devices have resulted in an increased need for efficient electromagnetic interference (EMI) containment. Specifically, due to the proximity of the electronics operating within a system and between two or more systems, electromagnetic interference must be contained to ensure that the operation of one device within one system does not deleteriously effect the operation of another device within the same system or an adjacent system.

For example, in a conventional computer chassis/card cage assembly, multiple slots are available to receive corresponding printed circuit assemblies (PCAs). In most cases, each region/slot in the chassis has either a printed circuit assembly (PCA) disposed therein or a filler panel to enclose or seal off regions/slots of the computer chassis which do not have a PCA. Typically, each region/slot utilizes an electromagnetic gasket (e.g., shield) around the bulkhead of the PCA or the filler panel to ensure EMI containment within the system.

In most cases, the utilization of the PCA, filler panel, chassis, and/or any other devices associated therewith are often defined by an industry standard. Typical standards include, for example, the compact peripheral component interconnect (CPCI) standard, and the VersaModular Eurocard (VME) standard. For example, the CPCI standard dictates that the gap between adjacent units (e.g. adjacent filler panels, adjacent PCAs, or a PCA and an adjacent filler panel) be nominally set at 0.30 millimeters. Thus, when multiple adjacent units are used, the stack-up of tolerances may cause some units to be more than 0.30 millimeters apart, while others may be less than 0.30 millimeters apart. Unfortunately, the size and shape of the electromagnetic gasket utilized therewith are based on the same manufacturing tolerances. That is, each electromagnetic gasket has an amount of manufactured spring and compression corresponding to a gap of 0.30 millimeters. However, because just as described it is not uncommon for adjacent units to have a smaller gap, a significant amount of force may be needed to compress the electromagnetic gasket between the two units. In the alternative case, adjacent units may be far enough apart that the electromagnetic gasket may not have enough spring to maintain adequate EMI containment.

In some cases, this mispositioning with respect to the electromagnetic gasket not only results in a loss or degradation of EMI containment, it may also deleteriously prevent or hinder insertion of a PCA or a filler panel. As explained above, adjacent units may actually end up further than 0.30 millimeters apart from each other. As a result, a unit adjacent to these units may have to be placed in a slot that ends up being less than 0.30 millimeters wide. This may make it difficult to insert the latter unit, in particular with the gasket in its correct position.

At present, one approach to fix the problem described above, is to first have all of the necessary panels (or PCAs) loosely connected to the computer chassis. Once all of the panels are in place, the panels are then carefully tightened to the computer chassis in order to insure that EMI seals are maintained. However, such a method is time-consuming, cumbersome, and lacks a desired "Design for Manufacturability (DFM)."

This problem is particularly egregious in light of the increased prevalence of "hot swapping." Hot swapping refers to a process in which a PCA is added to or removed from the computer chassis without powering down the system. With hot swapping, it is imperative that any interference is reduced in order to facilitate rapid and perhaps frequent removal and insertion of PCAs and filler panels.

A further problem has arisen with regard to the removal of filler panel assemblies. Specifically, as stated above, a filler panel mounted to a chassis is a tight fit. In fact, the EMI gasket causes a friction force which helps hold a filler panel in-place. Further, the face of the filler panel may be smooth with nothing to grasp. Thus, with a multiplicity of filler panels or complete assemblies mounted on a chassis, removal of a single filler panel may be both difficult and time consuming.

DISCLOSURE OF THE INVENTION

An electromagnetic shield assembly is disclosed. In one embodiment, the present invention is comprised of a frame. The present embodiment is further comprised of an electromagnetic gasket surrounding the frame. The present embodiment is also comprised of an actuating element coupled with the electromagnetic gasket. The actuating element is adapted to retract and deploy a portion of the electromagnetic gasket with respect to the frame to provide an adjustable electromagnetic interference (EMI) shield.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 3A, 3B, and 3C are perspective views of a retracted electromagnetic shield assembly removably coupled with a bulkhead in accordance with one embodiment of the present claimed invention.

FIGS. 4A, 4B, and 4C are perspective views of an extended electromagnetic shield assembly removably coupled with a bulkhead in accordance with one embodiment of the present claimed invention.

FIG. 5 is a perspective view of a chassis for removably coupling a bulkhead with an electromagnetic shield assembly in accordance with one embodiment of the present claimed invention.

The drawings referred to in this description should be understood as not being drawn to scale except if specifically noted.

BEST MODES FOR CARRYING OUT THE INVENTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. In other instances, well-known methods, procedures, components, and circuits have not been described in detail as not to unnecessarily obscure aspects of the present invention.

The following discussion will begin with a detailed description of the physical characteristics of the present electromagnetic shield assembly. The discussion will then contain a detailed description of the use and operation of the present electromagnetic shield assembly. In one embodiment, the invention provides a mechanism that permits quick removal and replacement of modules in equipment. Furthermore, the mechanism effects a quick removal and replacement while also maintaining electromagnetic shielding. In general, the mechanism translates the motion of an actuator in one direction to an increase in one or more dimensions of interface edges. Thus, as the actuator (e.g., an extractor handle) is moved, material (e.g., two or four edges of a bulkhead) is caused to expand. This expansion effects intimate contact between adjacent equipment modules that in turn ensures a low impedance path for radio frequency electrical currents. This low impedance bonding between adjacent modules or elements preserves the Faraday Cage (e.g., encloses sources of electromagnetic noise within the equipment). This shield reduces or eliminates noise that is emitted from the equipment which can cause interference to other radio frequency devices. It may also improve the immunity of the equipment to interference from other radio equipment.

Figure 1A:
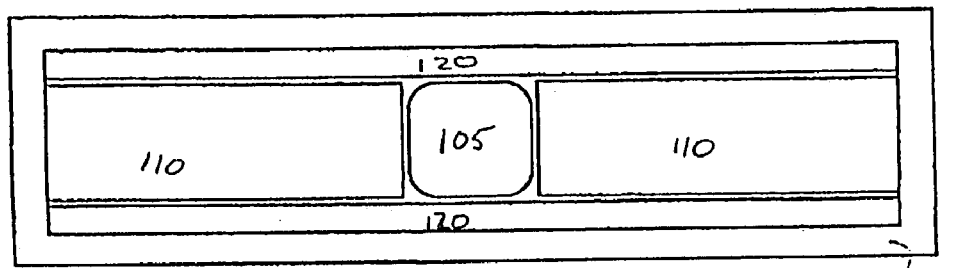
FIG. 1A is a perspective view of a retracted electromagnetic shield assembly in accordance with one embodiment of the present claimed invention.

With reference now to FIG. 1A, a perspective view of a retracted electromagnetic shield assembly is shown in accordance with an embodiment of the present claimed invention. Regarding the physical structure of the present electromagnetic shield assembly, for purposes of clarity, only the front side of the electromagnetic shield assembly 100 is shown in FIG. 1A. In the present embodiment, electromagnetic shield assembly 100 includes a frame 130 and electromagnetic gaskets 110 and 120. In one embodiment, a plurality of frames 130 may be utilized. That is, there may be a frame 130 on both sides of electromagnetic gaskets 110 and 120. However, for purposes of brevity and clarity, only one frame 130 is shown. As will be discussed in detail below, in one embodiment, both frame 130 and electromagnetic gaskets 110 and 120 are formed having dimensions and characteristics which are in compliance with an industry standard such as, for example, the compact peripheral component interconnect (CPCI) standard, and the VersaModular Eurocard (VME) standard.

Figure 1B:
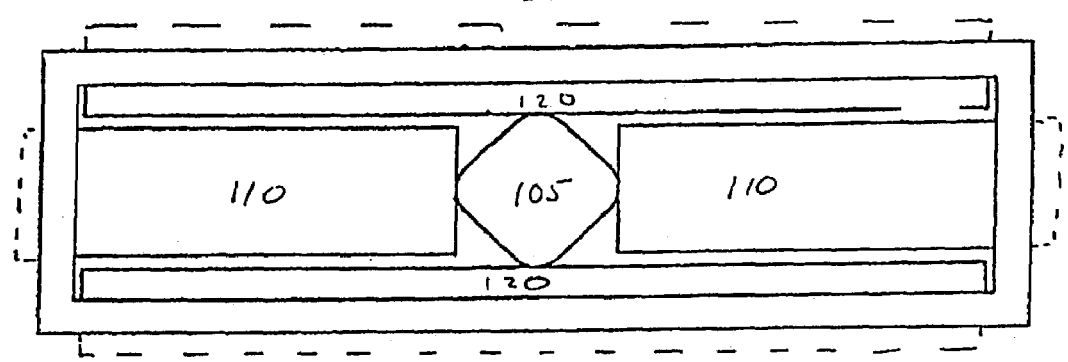
FIG. 1B is a perspective view of a deployed electromagnetic shield assembly in accordance with one embodiment of the present claimed invention.
Figure 1C:
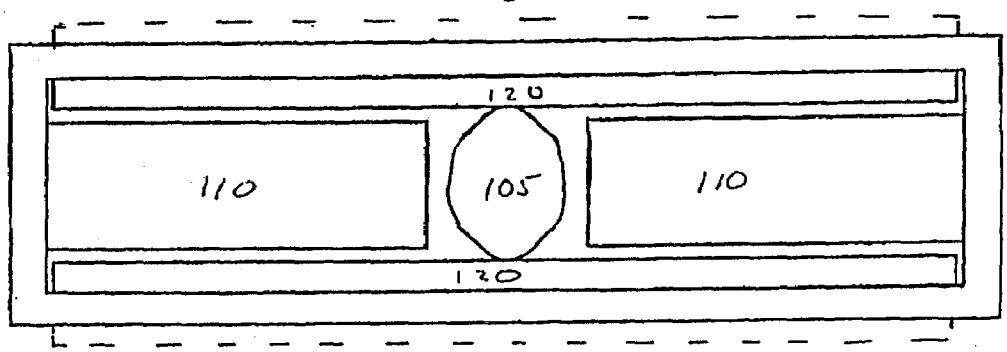
FIG. 1C is a perspective view of a deployed electromagnetic shield assembly in accordance with another embodiment of the present claimed invention.

In one embodiment, electromagnetic gaskets 110 and 120 may surround frame 130. That is, electromagnetic gaskets 110 and 120 may be two distinct gaskets which cover the perimeter of frame 130. Electromagnetic gaskets 110 and 120 may be comprised of elastomeric material (e.g., neoprene or the like) with a conductive outerlayer portion. In another embodiment, electromagnetic gaskets 110 and 120 may be comprised of a completely conductive material that may incorporate tongue and groove type formations to provide sufficient EMI shielding. Furthermore, as shown in FIGS. 1B and 1C, electromagnetic gaskets 110 and/or 120 may deploy in only two directions (e.g., lengthwise or widthwise), or in a plurality of directions with respect to frame 130. In one embodiment, electromagnetic gaskets 110 and 120 are employed to prevent electromagnetic interference (EMI) leakage from a structure (e.g., frame, chassis, electronic system, or the like) to which electromagnetic shield assembly 100 may be ultimately coupled.

Referring still to FIG. 1A, electromagnetic shield assembly 100 also includes an actuating element 105 (or control element 105, or operating element 105) which is adapted to be coupled with electromagnetic gaskets 110 and 120. In one embodiment, actuating element 105 is comprised of a cam. Actuating element 105 is ultimately employed for retracting and/or deploying a portion of electromagnetic gaskets 110 and/or 120 with respect to frame 130, thereby allowing electromagnetic gaskets 110 and/or 120 to provide an EMI shield for at least a portion of frame 130. Although actuating element 105 is shown in FIGS. 1A and 1B as having a rectangular shape, actuating element 105 may be formed in any number of possible geometric configurations which may operate in a fashion similar to that of cam 105. For example, as shown in FIG. 1C, actuating element 105 may have an oval shape thereby allowing it to deploy only one set of either electromagnetic gaskets 110 or 120. However, for purposes of brevity and clarity each of the numerous design possibilities for actuating element 105 are not shown in the present Figures.

With reference now to FIGS. 1B and 1C, perspective views of a deployed electromagnetic shield assembly are shown in accordance with embodiments of the present claimed invention. Specifically, FIGS. 1B and 1C are front views of a deployed electromagnetic shield assembly 150 and 175. In one embodiment, described in more detail herein, actuating element 105 is in a position to provide extension (e.g., deployment) of at least a portion of electromagnetic gaskets 110 and/or 120 with respect to frame 130. For example, actuating element 105 of FIG. 1B may be configured to maintain the extension of either electromagnetic gaskets 110, or electromagnetic gaskets 120 (e.g., FIG. 1C), or both electromagnetic gaskets 110 and 120 (e.g., FIG. 1B).

Figure 2A:
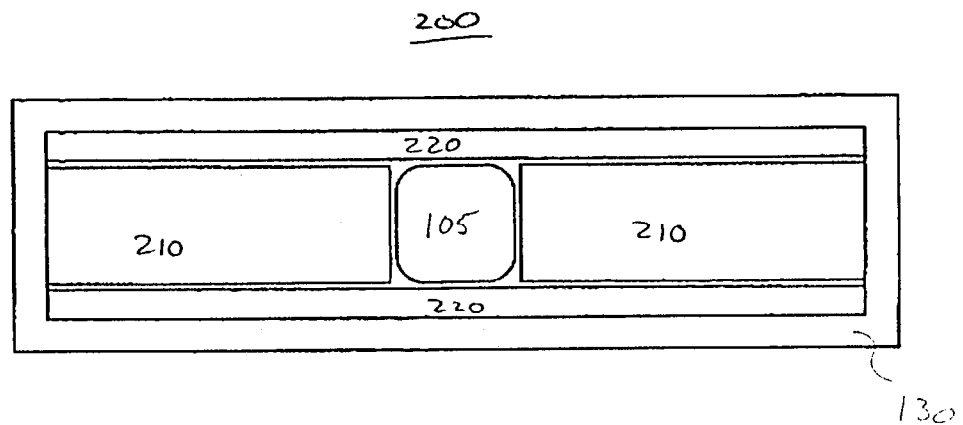
FIG. 2A is a perspective view of a retracted electromagnetic shield assembly in accordance with another embodiment of the present claimed invention.

With reference now to FIG. 2A, a perspective view of a retracted electromagnetic shield assembly is shown in accordance with another embodiment of the present claimed invention. Regarding the physical structure of the present electromagnetic shield assembly, for purposes of clarity, only the front side of electromagnetic shield assembly 200 is shown in FIG. 2A. In the present embodiment, electromagnetic shield assembly 100 includes a frame 130 and blocks 210 and 220. In FIG. 2A electromagnetic gasket 240 is retracted within frame 130 and is therefore out of view. In one embodiment, a plurality of frames 130 may be utilized. That is, there may be a frame 130 on both sides of blocks 210 and 220. However, for purposes of brevity and clarity, only one frame 130 is shown. As will be discussed in detail below, in one embodiment, both frame 130, blocks 210 and 220 and electromagnetic gasket 240 are formed having dimensions and characteristics which are in compliance with an industry standard such as, for example, the compact peripheral component interconnect (CPCI) standard, and the VersaModular Eurocard (VME) standard.

In one embodiment, blocks 210 and 220 may be manufactured from any type of material that may operate in conjunction with actuating device 105. For example, blocks 210 and 220 may be metal, alloy, or composite blocks which are rigid enough to maintain shape and not deform while maintaining electromagnetic gasket 240 in a deployed state. In one embodiment, blocks 210 and 220 hold electromagnetic gasket 240 in a position such that electromagnetic gasket 240 surrounds frame 130. That is, electromagnetic gasket 240 may be one complete gasket which covers the perimeter of frame 130.

Referring still to FIG. 2A, electromagnetic shield assembly 200 also includes an actuating element 105 (or control element 105, or operating element 105) which is adapted to be coupled with frame 130 and blocks 210 and 220. In one embodiment, actuating element 105 is comprised of a cam. Actuating element 105 is ultimately employed for retracting and/or deploying a portion of blocks 210 and 220 with respect to frame 130, thereby allowing blocks 210 and 220 to deploy electromagnetic gasket 240 to provide an EMI shield for at least a portion of frame 130. As will be discussed in detail below, actuating element 105 may be used to retract blocks 210 and 220 with respect to frame 130. In yet another embodiment, actuating element 105 may be used for both deployment and retraction of blocks 210 and 220 with respect to frame 130. Although actuating element 105 is shown having a rectangular shape, actuating element 105 may be formed in any number of possible geometric configurations which may operate in a fashion similar to that of cam 105. However, for purposes of brevity and clarity each of the numerous design possibilities for actuating element 105 are not shown in the present Figures.

Figure 2B:
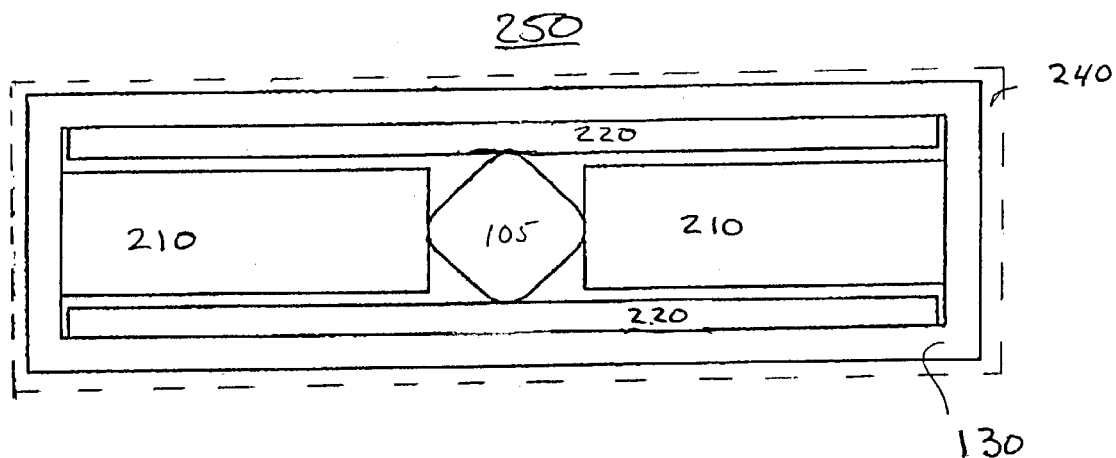
FIG. 2B is a perspective view of a deployed electromagnetic shield assembly in accordance with another embodiment of the present claimed invention.

With reference now to FIG. 2B, perspective views of a deployed electromagnetic shield assembly are shown in accordance with one embodiment of the present claimed invention. As described in more detail herein, actuating element 105 is in a position to provide extension (e.g., deployment) of at least a portion of blocks 210 and 220 with respect to frame 130. For example, actuating element 105 of FIG. 2B may be configured to maintain the extension of either blocks 210, or blocks 220, or both blocks 210 and 220 with respect to frame 130. This deployment of blocks 210 and 220 ultimately results in the deployment of electromagnetic gasket 240. As stated herein, electromagnetic gasket 240 may be comprised of elastomeric material (e.g., neoprene or the like) with a conductive outerlayer portion. In another embodiment, electromagnetic gasket 240 may be comprised of a completely conductive material that may incorporate tongue and groove type formations to provide sufficient EMI shielding. Furthermore, electromagnetic gasket 240 may deploy in only two directions, or in a plurality of directions with respect to frame 130 depending on the actuation of blocks 210 and 220. In one embodiment, electromagnetic gasket 240 is employed to prevent electromagnetic interference (EMI) leakage from a structure (e.g., frame, chassis, electronic system, or the like) to which electromagnetic shield assembly 100 may be ultimately coupled.

With reference now to FIGS. 3A through 3C, perspective views of a retracted electromagnetic shield assembly removably coupled with a bulkhead are shown in accordance with one embodiment of the present claimed invention. FIG. 3A is a side view of a retracted electromagnetic shield assembly removably coupled with a bulkhead 315. FIG. 3B is a top view of the same retracted electromagnetic shield assembly removably coupled with a bulkhead. FIG. 3C is a perspective view of the retracted electromagnetic shield assembly removably coupled with a bulkhead. In general, Bulkhead 315 may be utilized to hold printed circuit boards (PCBs) 335 or printed circuit assemblies (PCAs) 335. In another embodiment, bulkhead 315 may be utilized as a filler panel (e.g., a cover having no PCA 335 or PCB 335) to maintain the integrity of an electronic system. Although a bulkhead 315 is shown as the device with which electromagnetic gasket 320 is removably coupled, electromagnetic gasket 320 may be removably coupled with a plurality of devices which require an EMI shield. The use of a bulkhead 315 is merely for purposes of brevity and clarity. It is also appreciated that only a portion of PCA 335 or PCB 335 is shown.

Bulkhead assembly 300 (or 350 or 375) includes electromagnetic gasket 320. As will be discussed in detail below, in one embodiment, electromagnetic gasket 320 is formed having dimensions and characteristics which are in compliance with an industry standard such as, for example, the compact peripheral component interconnect (CPCI) standard, and the VersaModular Eurocard (VME) standard. Electromagnetic gasket 320 is employed to prevent EMI leakage from a structure (e.g., cage, chassis, electronic system, or the like) to which bulkhead assembly 300 may be ultimately coupled. Furthermore, electromagnetic gasket 320 may be removably coupleable with bulkhead 315 or fixedly coupled with bulkhead 315.

Referring still to FIG. 3A, bulkhead assembly 300 also includes operating element 310 which is adapted to be coupled with electromagnetic gasket 320. In one embodiment, operating element 310 is an extractor latch (or plurality of extractor latches). As will be discussed in detail below, in one embodiment, operating element 310 may be formed having dimensions and characteristics which are in compliance with an industry standard such as, for example, the CPCI standard, and the VME standard. Although operating element 310 is shown having a triangular shape, operating element 310 may have any number of possible geometric designs which may operate in a fashion similar to that of extractor 310. However, for purposes of brevity and clarity each of the numerous design possibilities for operating element 310 are not shown in the present Figures.

With reference still to FIG. 3A, operating element 310 may be used as the device for removably coupling bulkhead 315 with a structure such as a cage, chassis, electronic system, or the like (e.g., chassis 500 of FIG. 5). In addition, operating element 310 may be utilized in conjunction with extractor cams 330 to act as the actuating device for deployment and/or retraction of a portion of electromagnetic gasket 320. For example, in one embodiment, the manipulation (e.g., opening or closing) of operation element 310 may also operate the extractor cams 330 thereby providing deployment and/or retraction of a portion of electromagnetic gasket 320. Although operating element 310 is shown as an extractor latch 310 in FIGS. 3A through 3C, operating element 310 may be any number of mechanisms utilized in the art as a means for holding bulkhead 315 in place (e.g., screw, thumbscrew, lever, wedge, latch, knob, switch, catch, hook, buckle, pin, button, cam, gear, cog, or the like) with respect to a chassis.

With reference now to FIGS. 4A through 4C, perspective views of an extended electromagnetic shield assembly removably coupled with a bulkhead are shown in accordance with one embodiment of the present claimed invention. FIG. 4A is a side view of an extended electromagnetic shield assembly removably coupled with a bulkhead 315. FIG. 4B is a top view of the same extended electromagnetic shield assembly removably coupled with a bulkhead. FIG. 4C is a perspective view of the extended electromagnetic shield assembly removably coupled with a bulkhead. In one embodiment, described in more detail herein, operating element 310 is in a position to provide extension (e.g., deployment) of a portion of electromagnetic gasket 320. For example, operating element 310 of FIG. 4A may be configured to extend electromagnetic gasket 320 on only one side of bulkhead 315, or operating element 310 of FIG. 4A may be configured to extend electromagnetic gasket 320 on a plurality of sides of bulkhead 315.

With reference now to FIG. 5, a perspective view of a chassis for removably coupling a bulkhead with an electromagnetic shield assembly is shown in accordance with one embodiment of the present claimed invention. FIG. 5 includes chassis 500 which may be any type of structure utilized to hold electronics (e.g., a cage, chassis, or the like). Chassis 500 also includes slots such as slot 530 for receiving a removably coupleable bulkhead assemblies (e.g., assemblies 100, 200, 300, or 400). Furthermore, chassis 500 may have electronic connectors 560 (e.g., pins, pin holes, or the like) in a portion of each of the slots.

The following is a detailed description of the use and operation of the present electromagnetic shield assembly. With reference still to FIGS. 1A and 1B, electromagnetic shield assemblies 100 and 150 may be used to provide EMI shielding to an electronic system or device to which it is coupled. For example, a user may require an EMI shield (or seal) for an electronic structure (e.g., a computer chassis, or anything which may be modular and electronic). In order to employ electromagnetic shield assembly 100 a user would first ensure that the electromagnetic gaskets 110 and/or 120 are in a retracted state. The user may then install the electromagnetic shield assembly 100 and deploy electromagnetic gaskets 110 and/or 120 to provide the desired EMI shield (e.g., FIG. 1B). As described in more detail herein, the user may utilize actuating element 105 for deployment and retraction of electromagnetic gaskets 110 and/or 120.

For example, in one embodiment electromagnetic gaskets 110 and/or 120 may initially be stored in either a deployed state or in a retracted state with respect to frame 130. If they are stored in a deployed state, when electromagnetic shield assembly 100 is prepared for installation with respect to a chassis (e.g., chassis 500 of FIG. 5), actuating element 105 may be utilized (e.g., turned) to retract electromagnetic gaskets 110 and/or 120 with respect to frame 130 to allow unfettered installation of the electromagnetic shield assembly. Once assembly 100 is in position, actuating element 105 may be utilized to deploy electromagnetic gaskets 110 and/or 120 with respect to frame 130 to establish correct EMI shielding with respect to chassis 500. For example, if electromagnetic gaskets 110 and/or 120 are stored in a deployed state with respect to frame 130, then during installation with respect to chassis 500 actuating element 105 may be positioned to retract electromagnetic gaskets 110 and/or 120. Then, when placement is completed with respect to chassis 500 actuating element 105 may be repositioned to allow electromagnetic gaskets 110 and/or 120 to return to their deployed state with respect to frame 130.

In another embodiment, if electromagnetic gaskets 110 and/or 120 are stored in a retracted state with respect to frame 130, after placement with respect to chassis 500 is completed actuating element 105 may be utilized to deploy electromagnetic gaskets 110 and/or 120 with respect to frame 130. In one embodiment, actuating element 105 may include a retracted locking position, and/or a deployed locking position. In yet another embodiment, actuating element 105 may include an adjustable deployment locking position to allow electromagnetic gaskets 110 and/or 120 to have different deployable states to ensure complete EMI shielding. For example, an actuating element 105 having an adjustable deployment locking position will allow the electromagnetic shield assembly 100 to efficiently operate over a variety of larger or smaller opening. This "one-size-fits-all" approach will allow broad application of the electromagnetic shield assembly 100 while maintaining an EMI shield within a plethora of manufacturing tolerances and standards.

With reference now to FIGS. 2A and 2B, electromagnetic shield assembly 200 may be used to provide EMI shielding to an electronic system or device (e.g., chassis 500 of FIG. 5) to which it is coupled in the same manner as described in FIGS. 1A and 1B. In order to employ electromagnetic shield assembly 200 a user may first ensure that blocks 210 and 220 are in a retracted state. The user may then install the electromagnetic shield assembly 200 with respect to chassis 500 and deploy blocks 210 and 220 to provide the desired EMI shielding (e.g., FIG. 2B).

For example, in one embodiment blocks 210 and 220 and therefore electromagnetic gasket 240 may initially be stored in either a deployed state or in a retracted state with respect to frame 130. If they are stored in a deployed state, when electromagnetic shield assembly 200 is prepared for installation with respect to chassis 500 of FIG. 5, actuating element 105 may be utilized (e.g., turned) to retract blocks 210 and 220 and therefore electromagnetic gasket 240 with respect to frame 130 to allow unhindered installation of the electromagnetic shield assembly. Once assembly 200 is in position with respect to chassis 500, actuating element 105 may be utilized to deploy blocks 210 and 220 and therefore electromagnetic gasket 240 with respect to frame 130 to establish EMI shielding. For example, if blocks 210 and 220 are stored in a deployed state with respect to frame 130, then during installation actuating element 105 may be positioned to retract blocks 210 and 220 and therefore electromagnetic gasket 240. Then, when placement is completed actuating element 105 may be repositioned to allow blocks 210 and 220 to return to their deployed state with respect to frame 130.

In another embodiment, if blocks 210 and 220 are stored in a retracted state with respect to frame 130, after assembly 200 placement is completed actuating element 105 may be utilized to deploy blocks 210 and 220 and therefore electromagnetic gasket 240 with respect to frame 130. In one embodiment, actuating element 105 may include a retracted locking position, and/or a deployed locking position. In yet another embodiment, actuating element 105 may include an adjustable deployment locking position to allow blocks 210 and 220 to have different deployable states to ensure complete EMI shielding. For example, an actuating element 105 having an adjustable deployment locking position will allow the electromagnetic shield assembly 200 to efficiently operate over a variety of larger or smaller opening. This "one-size-fits-all" approach will allow broad application of the electromagnetic shield assembly 200 while maintaining an EMI shield throughout a range of manufacturing tolerances and standards.

With reference now to FIG. 3A, in one embodiment of the present invention, the cover with removably coupleable electromagnetic shield assembly 300 (or 350, or 375) may be comprised of a cover such as a bulkhead 315 and an electromagnetic shield assembly (e.g., 100 or 200 of FIG. 1A or 2A). For example, a user may have a bulkhead 315 which requires an EMI shield. Therefore, the user may removably couple assembly 100 with bulkhead 315. In addition, the user may utilize extractor 310 (instead of actuating element 105) in conjunction with extractor cams 330 to retract and/or deploy electromagnetic gasket 320. For example, electromagnetic gasket 320 may be mechanically linked with extractor 310 via extractor cams 330 such that when extractor 310 is opened extractor cams 330 retract electromagnetic gasket 320. In another embodiment, electromagnetic gasket 320 may be mechanically linked with extractor 310 via extractor cams 330 such that when extractor 310 is closed extractor cams 330 deploy electromagnetic gasket 320.

Referring still to FIG. 3A, in another embodiment, assembly 300 may be similar to that of assembly 100 (of FIG. 1A), except that frame 130 of FIG. 1A may be replaced with bulkhead 315 of FIG. 3A. That is, electromagnetic gasket 320 and extractor cams 330 may be coupled with bulkhead 315 and extractor 310 during the manufacture of bulkhead 315. In another embodiment, electromagnetic gasket 320 and extractor cams 330 may be coupled with bulkhead 315 and extractor 310 during the preparation for bulkhead installation. Thus, as described herein, when the bulkhead is installed in a system, electromagnetic gasket 320 may be retracted when extractor 310 is opened, and electromagnetic gasket 320 may be deployed when extractor 310 is closed.

In one embodiment of the present invention, as shown in FIG. 3A, electromagnetic gasket 320 is coupled to bulkhead 315 such that the top surface of electromagnetic gasket 320 is flush with the outside edge of bulkhead 315. In another embodiment, electromagnetic gasket 320 may be recessed within the bounds of the outside edge of bulkhead 315. In general, the top surface of electromagnetic gasket 320 may be flush with or recessed within the outside edge of bulkhead 315 such that during the insertion of bulkhead 315 with respect to a chassis (or cage, or electrical structure), the friction force between electromagnetic gasket 320 and any devices (e.g., other frames, covers, structures, bulkheads, or the like) located on or coupled with the chassis are reduced. This reduction in friction force may assist a user in both the coupling and decoupling of bulkhead 315 with respect to a filler panel body.

For example, electromagnetic gasket 320 may be coupled to bulkhead 315 at a location such that while bulkhead 315 is being removably coupled with a computer chassis (e.g., chassis 500), electromagnetic gasket 320 may be retracted thereby not providing an electromagnetic interference (EMI) shield around a portion of bulkhead 315. That is, electromagnetic gasket 320 may be removably coupled to bulkhead 315 such that when a user unlocks extractors 310 to couple or de-couple bulkhead 315, extractor cams 330 retract electromagnetic gasket 320 thereby reducing the overall footprint of bulkhead 315. As a result, during the coupling or de-coupling of bulkhead 315 with chassis 500, the present invention allows bulkhead 315 to be positioned without concern for deleterious interference of electromagnetic gasket 320.

With reference now to FIGS. 4A through 4C, in one embodiment of the present invention, after bulkhead 315 is removably coupled with a chassis, electromagnetic gasket 320 may be deployed to provide an electromagnetic interference (EMI) shield around a portion of bulkhead 315. For example, after a user positions bulkhead 315 into position with respect to a chassis, the act of locking extractors 310 may also initiate extractor cams 330 to deploy electromagnetic gasket 320. The deployment of electromagnetic gasket 320 will provide an EMI shield for bulkhead 315 while also maintaining the nominal specified spacing between any adjacent device (e.g. another filler panel or a PCA) as required by CPCI or VME standards.

With reference now to FIG. 5, a plurality of bulkheads and electromagnetic shield assemblies are shown in various stages of attachment with respect to a chassis. In one embodiment, chassis 500 includes a plurality of slots similar in manufacture to that of slot 530. That is, the slots may be manufactured to a standard such as CPCI or VME. In addition, each slot may be filled with either complete assemblies (e.g., bulkhead with PCA and EMI shielding) or with filler type panels having no PCA or PCB but functioning merely as EMI shields. Slots 520 and 540 may be covered with electromagnetic shield assemblies such as electromagnetic shield assemblies 100 which may be acting as either complete assemblies or as a filler panels. Furthermore, each of the other slots (e.g., 550) are covered with electromagnetic shield assemblies such as electromagnetic shield assemblies 300 or 400 which may also be acting as either complete assemblies or as a filler panels.

FIG. 5 shows embodiments for both the deployed state and the retracted state of an electromagnetic shield assembly. For example, electromagnetic shield assembly 575 is shown in a deployed state, with the entire opening of slot 520 covered with an EMI shield. Conversely, electromagnetic shield assembly 585 is shown in a retracted state, wherein the entire opening of slot 540 is not covered with an EMI shield and there are gaps 570 around the edges. It is also appreciated that the electromagnetic shield assembly shown in the retracted state could have been an electromagnetic shield assembly 300 or 400. However, for purposes of brevity and clarity, only electromagnetic shield assembly 100 or 200 is shown.

Figure 6:
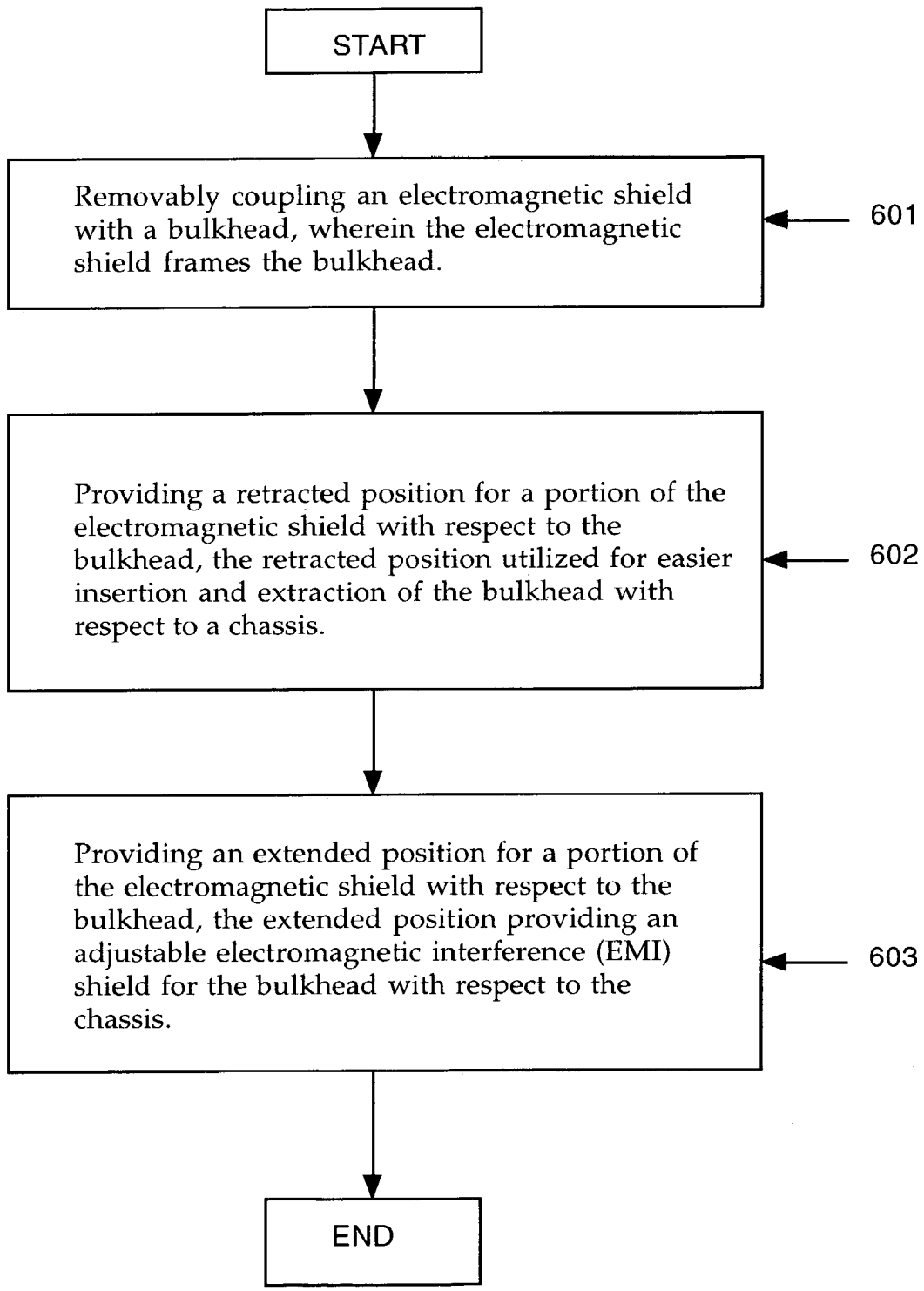
FIG. 6 is a flow chart of steps performed in accordance with one embodiment of the present claimed invention.

With reference now to FIG. 6, a flow chart 600 summarizing the steps performed in accordance with one embodiment of the present invention is shown. At step 601, the present embodiment removably couples an electromagnetic shield with a bulkhead, wherein the electromagnetic shield frames the bulkhead. As described in detail above, in one embodiment the electromagnetic shield (e.g. electromagnetic shield 320 of FIGS. 3A and 4A) is adapted to removably couple with bulkhead 315 in accordance with CPCI or VME standards.

Next, at step 602, the present embodiment provides a retracted position for a portion of the electromagnetic shield with respect to the bulkhead, wherein the retracted position may be utilized for easier insertion and extraction of the bulkhead with respect to a chassis (e.g., chassis 500 of FIG. 5). As described in detail above, the electromagnetic shield (e.g. electromagnetic shield 320 of FIGS. 3A and 4A) is adapted to retract with respect to the bulkhead (or cover) to reduce the insertion force as well as the area of the bulkhead footprint while the bulkhead is removably coupled with respect to a frame.

With reference still to FIG. 6, and now to step 603, the present embodiment provides an extended position for a portion of the electromagnetic shield with respect to the bulkhead, wherein the extended position may provide an adjustable electromagnetic interference (EMI) shield for the bulkhead with respect to the chassis (e.g., chassis 500 of FIG. 5). As described in detail above, the electromagnetic shield (e.g. electromagnetic shield 320 of FIGS. 3A and 4A) is adapted to deploy with respect to the bulkhead (or cover) to provide an electromagnetic interference (EMI) shield around a portion of the bulkhead while the bulkhead is removably coupled with respect to the frame.

Beneficially, the present embodiment eliminates the need to first have all of the necessary covers loosely connected to the chassis and then subsequently tighten the arranged covers. Instead, the present embodiment allows cover assemblies to be independently coupled to a chassis (e.g., a computer chassis) at any time without concern for the subsequent attachment of additional covers (e.g., bulkheads, filler panels, or PCAs). Thus, the present invention achieves a "Design for Manufacturability" lacking in the prior art. Additionally, by reducing interference and enabling the independent attachment of cover assemblies to a chassis, the present invention is extremely well suited to use in hot swapping environments.

Thus, the present invention provides a method and apparatus for an electromagnetic shield assembly which decreases insertion issues with respect to a frame. The present invention also provides a method and apparatus for an electromagnetic shield assembly which achieves the above accomplishment and which facilitates hot swapping of PCA cards. The present invention also provides a method and apparatus for an electromagnetic shield assembly which achieves the above accomplishments and which can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electromagnetic shield assembly comprising:
    a frame;
    an electromagnetic gasket surrounding said frame; and
    an actuating element coupled with said frame and said electromagnetic gasket, said actuating element adapted to retract and deploy a portion of said electromagnetic gasket with respect to said frame to provide an adjustable electromagnetic interference (EMI) shield.

2. The electromagnetic shield assembly of claim 1, wherein said electromagnetic gasket is an elastomeric material with a conductive outerlayer portion.

3. The electromagnetic shield assembly of claim 1 wherein said electromagnetic gasket deploys in contrasting directions with respect to said frame.

4. The electromagnetic shield assembly of claim 1 wherein said electromagnetic gasket deploys on all sides of said frame.

5. The electromagnetic shield assembly of claim 1 wherein said frame and said electromagnetic gasket are manufactured in accordance with a compact peripheral component interconnect (CPCI) standard.

6. The electromagnetic shield assembly of claim 1 wherein said frame and said electromagnetic gasket are manufactured in accordance with a VersaModular Eurocard (VME) standard.

7. The electromagnetic shield assembly of claim 1, wherein said actuating element is a cam.

8. The electromagnetic shield assembly of claim 1, wherein said actuating element is an extractor latch.

9. A method for reducing the friction force of an electromagnetic shield with respect to a chassis comprising:
    a) removably coupling an electromagnetic shield with a bulkhead, wherein said electromagnetic shield frames said bulkhead;
    b) providing a retracted position for a portion of said electromagnetic shield with respect to said bulkhead, said retracted position utilized for easier insertion and extraction of said bulkhead with respect to a chassis; and
    c) providing an extended position for a portion of said electromagnetic shield with respect to said bulkhead, said extended position providing an adjustable electromagnetic interference (EMI) shield for said bulkhead with respect to said chassis.

10. The method as recited in claim 9 step c) wherein said electromagnetic shield is adapted to extend around a portion of said bulkhead in accordance with a compact peripheral component interconnect (CPCI) standard.

11. The method as recited in claim 9 step c) wherein said electromagnetic shield is adapted to extend around a portion of said bulkhead in accordance with a VersaModular Eurocard (VME) standard.

12. The method as recited in claim 9 step c) wherein said electromagnetic shield is adapted to deploy in contrasting directions with respect to said bulkhead.

13. The method as recited in claim 9 step c) wherein said electromagnetic shield is adapted to extend on all sides of said bulkhead.

14. The method as recited in claim 9 further comprising coupling an control element with said electromagnetic shield, said control element for controlling the motion of said electromagnetic shield.

15. The method as recited in claim 14 wherein said control element is a cam.

16. The method as recited in claim 14 wherein said control element is an extractor latch.

17. A cover with a removably coupleable electromagnetic shield assembly comprising:
    a cover;
    an electromagnetic gasket framing said cover; and
    an operating element coupled with said electromagnetic gasket, said operating element adapted to retract and deploy a portion of said electromagnetic gasket with respect to said cover to reduce insertion force when said cover is removably coupled with respect to a chassis and to provide an adjustable electromagnetic interference (EMI) shield around a portion of said cover while said cover is removably coupled with respect to said chassis.

18. The cover with removably coupleable electromagnetic shield assembly of claim 17 wherein said cover is removably coupled with said chassis in accordance with a compact peripheral component interconnect (CPCI) standard.

19. The cover with removably coupleable electromagnetic shield assembly of claim 17 wherein said cover is removably coupled with said chassis in accordance with a VersaModular Eurocard (VME) standard.

20. The cover with removably coupleable electromagnetic shield assembly of claim 17, wherein said operating element is a cam.

21. The cover with removably coupleable electromagnetic shield assembly of claim 17, wherein said operating element is a latch.

* * * * *